United States Patent
Lee

(10) Patent No.: US 6,332,000 B1
(45) Date of Patent: Dec. 18, 2001

(54) TIME DIVISION EQUALIZER USING SYSTEM CLOCK SIGNAL FASTER THAN SYMBOL CLOCK SIGNAL IN HIGH-SPEED COMMUNICATION

(75) Inventor: Duck Myung Lee, Ichon-shi (KR)

(73) Assignee: Hyundai Electronics Industries Co., Ltd. (KR)

( * ) Notice: Subject to any disclaimer, the term of this patent is extended or adjusted under 35 U.S.C. 154(b) by 0 days.

(21) Appl. No.: 09/074,436

(22) Filed: May 7, 1998

(30) Foreign Application Priority Data

May 8, 1997 (KR) .................................................. 97-17725

(51) Int. Cl.[7] ...................................................... H03H 7/40
(52) U.S. Cl. .............................. 375/232; 333/18; 708/323
(58) Field of Search ................................... 375/142, 229, 375/230, 231, 232, 233, 234, 235, 236; 333/18; 708/322, 323

(56) References Cited

U.S. PATENT DOCUMENTS

| | | | |
|---|---|---|---|
| 3,814,917 | * 6/1974 | Nussbaumer | 708/307 |
| 3,868,603 | * 2/1975 | Guidoux | 333/18 |
| 5,285,474 | 2/1994 | Chow et al. | 375/13 |
| 5,359,624 | * 10/1994 | Lee et al. | 375/142 |
| 5,450,339 | * 9/1995 | Chester et al. | 708/322 |
| 5,579,340 | * 11/1996 | Tokuriki et al. | 375/232 |
| 5,642,382 | * 6/1997 | Juan | 375/232 |
| 6,209,014 | * 3/2001 | Prasad | 708/322 |

* cited by examiner

Primary Examiner—Stephen Chin
Assistant Examiner—Chieh M. Fan
(74) Attorney, Agent, or Firm—Blakely Sokoloff Taylor & Zafman

(57) ABSTRACT

An equalizer according to the present invention includes a plurality of switch elements for selecting output data from the delaying elements in response to the odd and even clock signals. The odd and even clock signals are, in time division mode, produced by the system clock signal which is faster than a symbol clock signal. The present invention can reduce the number of multipliers. For example, a convolutional operating part of the equalizer having N flip-flops as a delaying element, only N/2 multipliers are needed.

11 Claims, 5 Drawing Sheets

TIME DIVISION EQUALIZER USING SYSTEM CLOCK SIGNAL FASTER THAN SYMBOL CLOCK SIGNAL IN HIGH-SPEED COMMUNICATION

BACKGROUND OF THE INVENTION

1. Field of the Invention

The present invention relates to an equalizer used in a high-speed communication, and more particularly to a time division equalizer capable of decreasing the number of multipliers.

2. Description of the Related Art

Recently, with the remarkable development in hardware and software techniques and user's demands for high-quality and high-speed which may be incorporated in a multi-functional communication system, the information service field has been dramatically innovated. In this information service field, the real-time data transmission with a high quality may be essential to the communication techniques.

The communication system may be divided into the wire communication and the wireless communication. However, both these communications contain distortions such as a multinterference and a white noise. In the case where the channel distortion is very poor, the reliability of data demodulated at a receiving terminal is debased so that the signal-to-noise rate is deteriorated. As a result, it is impossible to provide a good quality of communication service for users. Accordingly, for removing the noise signals other than the object signal, most modems contain an adaptive equalizer, which makes an pre-estimate of the time-variant channel characteristics.

For example, the adaptive equalizer has been used in a receiver of the VSB (Vestigial Side Band) modem which is based on the ground broadcast of the ATV (Advanced TV) in America. The multipliers corresponding to the number of tabs are needed in not only an adaptive filter used in such an adaptive equalizer but also the high-speed filter. In the case where the filter is implemented with hardware, there is a problem on its large size. Further, in the case where the filter is an adaptive filter in the blind equalizing mode in which the tab coefficient is updated for one sampling period, the adaptive filter needs multipliers twice as many as those in other modes.

FIG. 1 is a circuit diagram illustrating a conventional equalizer. As shown in FIG. 1, the conventional equalizer includes a delaying part 11, a coefficient updating parts 12, a convolutional operating part 13, a feed-back filtering part 14 and an error value generating part 15. The delaying part 11 includes a plurality of flip-flops coupled in series to one another, delaying input data for a predetermined time in response to a symbol signal. Each of the coefficient updating parts 12 receives the delayed data and the previous error value and then updates the coefficient. The convolutional operating part 13 multiplies each updated coefficient by the delayed data using a plurality of multipliers, and sums up the outputs of the multipliers. The feed-back filtering part 14 is coupled between the adder in the convolutional operating part 13 and the output terminal of the equalizer, for filtering the output of the adder. The error value generating part 15 coupled between the output terminal of the equalizer and the coefficient updating parts 12 calculates the error value of the equalizer.

Referring again to FIG. 1, the convolutional operating part 13 has N multipliers and the coefficient updating parts 12 has N multipliers so that the adaptive equalizer are in need of 2N multipliers. Accordingly, when such a conventional equalizer is fabricated on a single semiconductor chip, a large area is required.

SUMMARY OF THE INVENTION

Therefore, an object of the present invention is to provide an equalizer occupying small chip size, by decreasing the number of multipliers using a time division mode.

Another object of the present invention is to provide equalizer which can be implemented by a small number of tabs of the filter with the reduction of its manufacturing cost.

In accordance with an aspect of the present invention, there is provided an adaptive equalizer comprising: a plurality of first delaying means for delaying input data in response to a symbol clock signal; a clock generating means for producing a plurality of control signals using a system clock signal which is faster than a symbol clock signal, for classifying the delayed data; a plurality of selecting means for selecting output data from the first delaying means in response to the control signals provided by the clock generating means; a plurality of coefficient value updating means for receiving a previous error value and alternatively receiving the delayed and selected input data and then updating a coefficient value; a convolutional operating means for receiving outputs of the coefficient value updating means and alternatively receiving the delayed and selected input data; and an error value generating means for calculating an error value from an output of the convolutional operating means and providing the calculated error to the plurality of coefficient value updating means.

In accordance with another aspect of the present invention, there is provided an adaptive equalizer including a plurality of delaying means for delaying input data in response to a symbol clock signal, a plurality of coefficient value updating means, a convolutional operating means and an error value generating means, the adaptive equalizer comprising: a plurality of selecting means for selecting output data from the first delaying means in response to the control signals; and a clock generating means for producing, in time division mode, the control signals using a system clock signal which is faster than a symbol clock signal, for classifying the delayed data, wherein the control signals are out of phase;

BRIEF DESCRIPTION OF THE DRAWINGS

The above and other objects, advantages and features of the present invention will be more apparent from the following detailed description taken with the attached drawings, in which.

DETAILED DESCRIPTION OF THE PREFERRED EMBODIMENT

Hereinafter, the time division equalizer according to the present invention will be described in detail referring to the accompanying drawings.

The principle of the present invention is to provide multipliers capable of performing two or more multiplications for only one sampling period when the sampling period $T_s$ of a filter is twice as long as the delay time $D_t$ of a multiplier, that is, $T_s > (D_t/2)$.

For example, in the case where the VSB modem which is based on the ground broadcast in America, since the data sampling period is 1/10.76 MHz much longer than the delay time of the typical 12×10 multipliers, it is possible to use a system clock signal n times as fast as the sampling period. Accordingly, to reduce the number of multipliers, the equalizer according to the present invention uses such a fast system clock signal. Under the use of such a fast system clock signal, the equalizer allows multipliers to be decreased in number. That is, in the n-time division mode, 1/n multipliers may be needed in performing the same operation as the conventional equalizer.

As well-known to those skilled in the art to which the subject matter pertains, the equalizer, which is a broadcast receiver loaded with in order to receive good picture data in quality, supports the blind equalizing algorithm used for irregular and rapidly changing transmitting channel, as well as the basic algorithms such as a training sequence and decision-directive algorithm. The blind equalizing algorithm is classified into three algorithms, for example, the Godard algorithm, the Sato algorithm and the Stop-Go algorithm, according to the generation of the reference signals.

It should be noted that the equalizer which is one of the adaptive filters. The adaptive filters can be divided by the error updating methods. The LMS (least mean square) algorithm is widely used in the adaptive filter, considering its performance and economic benefit, and the LMS algorithm is expressed as follows:

$$W_{k+1} = W_k + 2 v e_k X_k \qquad \text{Eq. (1)}$$

where "W" is a tab coefficient, "X" is a delayed input, "e" is an error and "v" is a convergent coefficient.

The convergent speed and performance of the adaptive filter, which is of trade-off, may be controlled by the convergent coefficient.

The present invention will be described based on the LMS algorithm recommended by the ATV standard for digital broadcast in America. However, it should be noted that the present invention can support each of the above-mentioned algorithms or others. present invention is twice as fast as the symbol period, assuming that the symbol period is the same the sampling period. Two clock signals, odd clock and even clock signals Clk_odd and Clk_even, may be produced out of phase.

Figure 1:
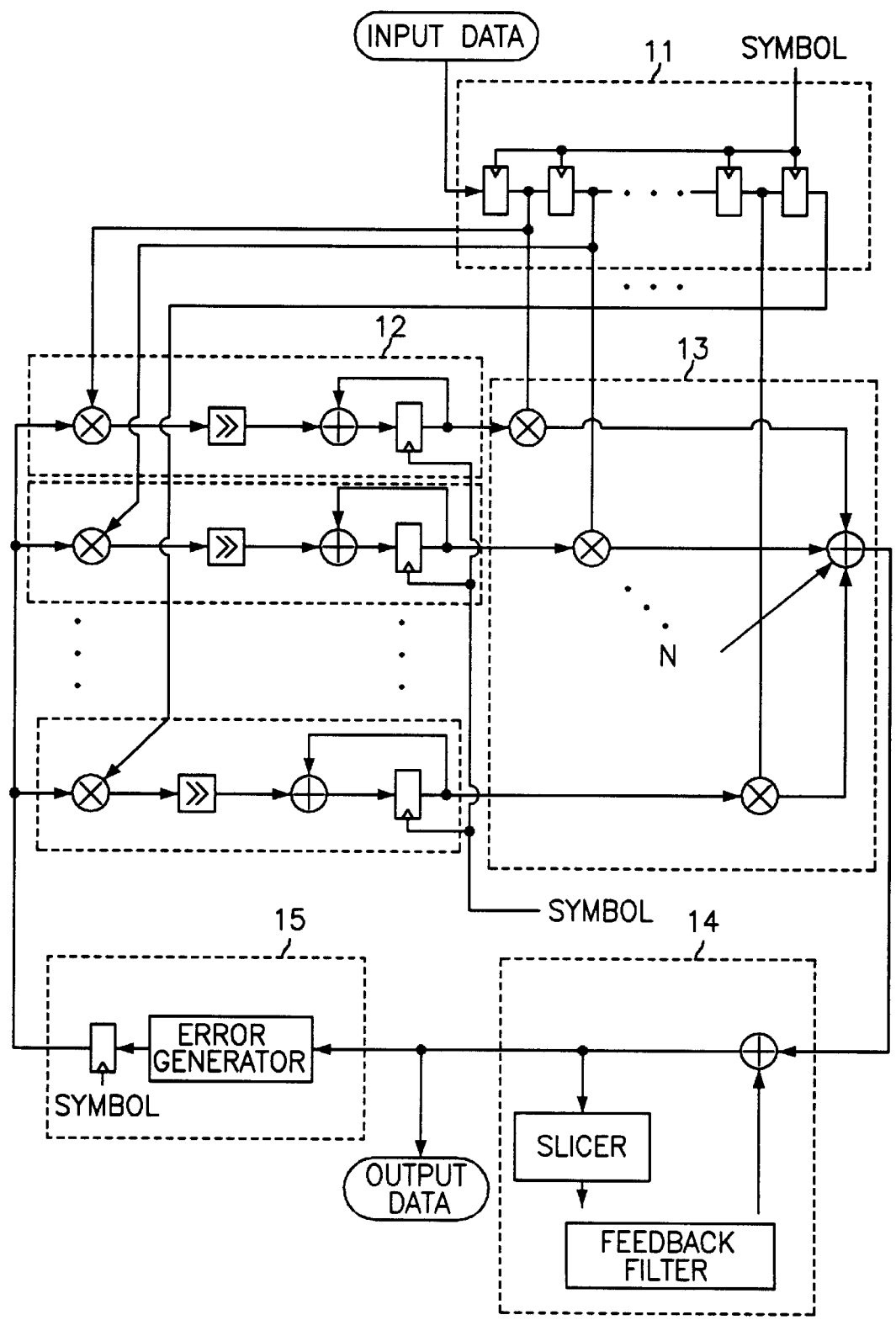
FIG. 1 is a circuit diagram illustrating a conventional equalizer.
Figure 2:
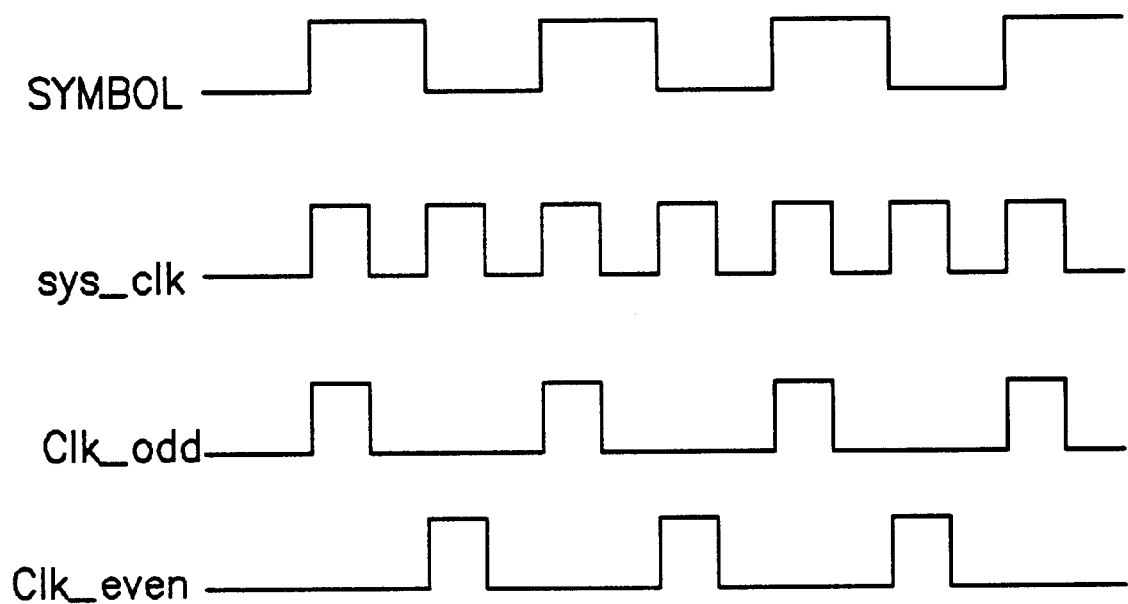
FIG. 2 is a timing chart of clock signals used in an equalizer according to the present invention.
Figure 3:
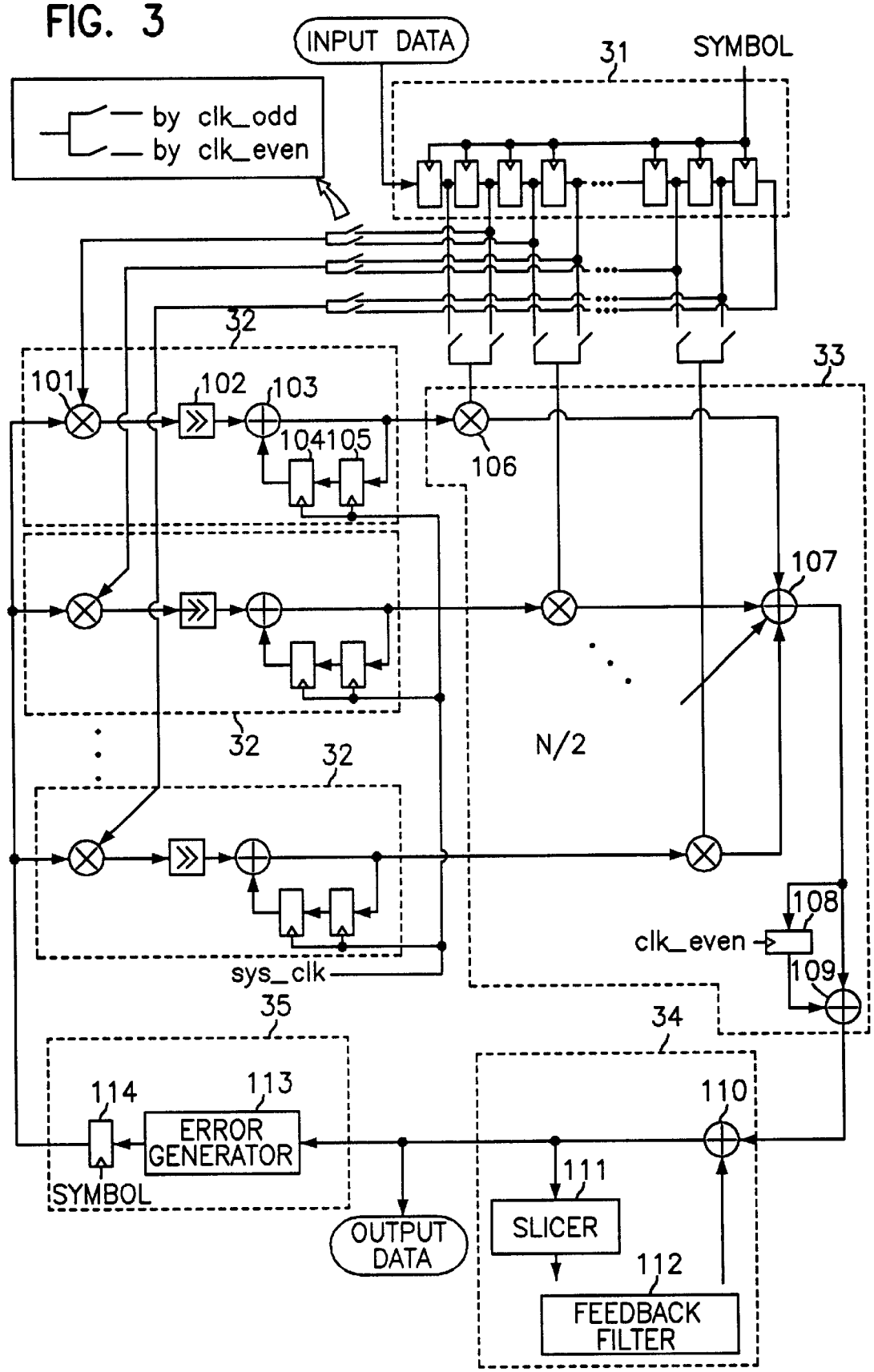
FIG. 3 is a circuit diagram illustrating the time division equalizer according to an embodiment of the present invention.

FIG. 3 is a circuit diagram illustrating the time division equalizer according to an embodiment of the present invention. In similar to the prior art, the equalizer according to the present invention includes a delaying part 31, a coefficient updating parts 32, a convolutional operating part 33, a feed-back filtering part 34 and an error value generating part 35.

The delaying part 31 includes a plurality of flip-flops coupled in series to one another and then delays an input data for a predetermined time by shifting the input data in response to a symbol signal. In the case of the N-tab filter, the equalizer is in need of N flip-flops coupled in series to one another. The sequential data input into the delaying part 31 is alternatively selected by the odd clock signal Clk_odd and the even clock signal Clk_even generated in a clock signal generator (not shown). The output from the even flip-flops is selected by the odd clock signal Clk_odd and the output from the odd flip-flops is selected by the even clock signal Clk_even. The selected data in response to the odd clock signal Clk_odd and the even clock signal Clk_even is input into multipliers 101 in the coefficient updating parts 32 and multipliers 106 in the convolutional operating part 33.

The equalizer according to the present invention includes N/2 coefficient updating parts 32. Each of them updates the coefficient, receiving an error value produced by the previous operation and the odd or even data from the current delaying part 31. Each of the coefficient updating parts 32 includes the multiplier receiving an error value produced by the previous operation and the odd or even data from the current delaying part 31 and a shifter register 102 shifting the output of the multiplier 101. Also, the coefficient updating parts 32 includes a delaying element, such as series-coupled flip-flops 104 and 105 for delaying a coefficient calculated for the previous symbol period and further includes an adder 103 for adding the output from the shifter register 102 to the output from the delaying element.

On the other hand, the series-coupled flip-flops 104 and 105 are synchronized with the system clock which is twice as fast as the symbol period. Accordingly, the coefficient updating parts 32 according to the present invention should have two flip-flops 104 and 105 due to the time division.

Comparing the above equation Eq(1) with the coefficient updating parts 32, the shift register 102 is associated with the convergent coefficient v in equation Eq(1). That is, if the convergent coefficient v is less than 1 and is expressed as the order of 2, the shift register 102 may be used as a multiplier.

The delayed input data are multiplied by the feed-back error values from the error value generating part 35 through N/2 multipliers 101. The output of the first flip-flop is input into the first multiplier 106 in the convolutional operating part 33 in response to the odd clock signal Clk_odd. The output of the second flip-flop is input into the first multiplier 101 in the coefficient value updating part 32 in response to the odd clock signal Clk_odd. On the other hand, the output of the second flip-flop may be input into the first multiplier 106 in the convolutional operating part 33 in response to the even clock signal Clk_even. Further, the output of the third flip-flop is input into the first multiplier 101 in the coefficient value updating part 32 in response to the even clock signal Clk_even and also the output of the third flip-flop is input into the second multiplier 106 in the convolutional operating part 33 in response to the odd clock signal Clk_odd.

In such a manner mentioned above, convolutional operation is carried out in the convolutional operating part 33, by multiplying the tab coefficient values by the delayed input data. In the time division mode using the system clock signal, which is twice as fast as the symbol period, and the odd and even clock signals, the convolutional operating part 33 has only N/2 multipliers 106 and one adder 107 adding the outputs thereof. Further, because the final result of the equalizer according to the present invention may be obtained by the summation of the outputs of the N/2 multipliers 106 in response to the odd or even clock signals Clk_odd or Clk_even, the convolutional operating part 33 according to the present invention further includes a flip-flop 108 for delaying the convolution-delayed data and an adder 109 for adding the output of the flip-flop 108 to the output of the adder 107.

When the equalizer has a feed-back loop using feed-forward filter and a feed-back filter to improve its performance, the final output of the equalizer is obtained by an adder 110 to add the output of the adder 109 to the output of a feed-back filter 112. Also, the output of the adder 110 is feed back to the feed-back filter 112 through a slicer 111.

On the other hand, in order to support all algorithms which can be divided by the error generating methods, an error value generator 113 in the error value generating part 35 receives as a reference signal, the multiplexer selecting signal indicating the kind of algorithm. The error value is latched in a flip-flop 114 in response to the symbol clock and the latched error value is input into the multiplier 101 of the coefficient updating parts 32.

Figure 4:
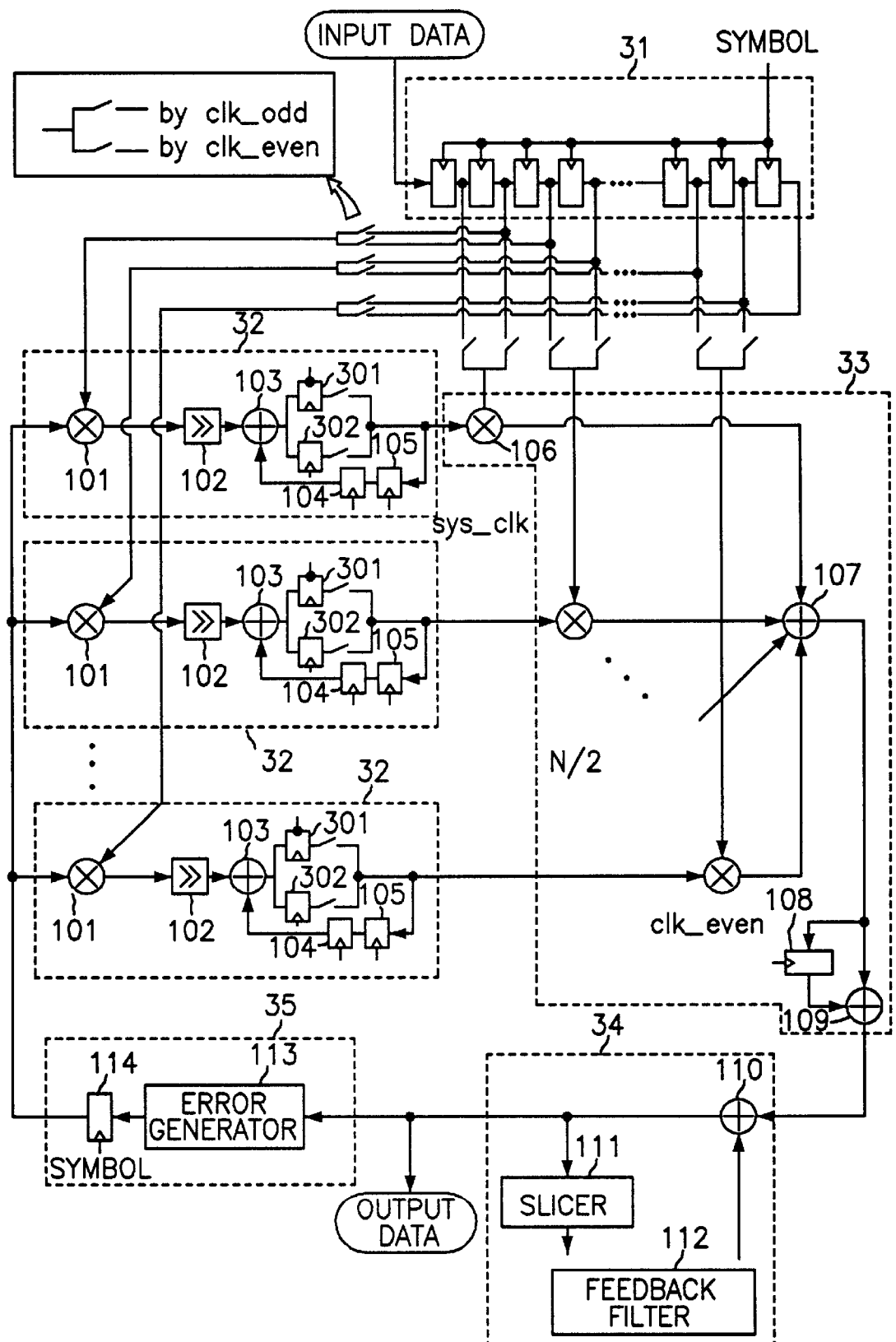
FIG. 4 is a circuit diagram illustrating the time division equalizer according to another embodiment of the present invention.

FIG. 4 is a circuit diagram illustrating the time division equalizer according to another embodiment of the present invention. The elements shown in FIG. 4 which are the same as those in FIG. 3 has the same reference numerals. As shown in FIG. 4, the coefficient updating parts 32 further includes two delaying elements consisting of flip-flops 301 and 302 coupled in parallel to the adder 103. After latching the output of the multiplier 101 to store the coefficient value for the symbol period, the flip-flops 301 and 302 selectively provide the output of the adder 103 to the flip-flops 104 and 105 in response to the odd and even clock signal Clk__odd and Clk__even.

By doing so, although the delayed time, which is made in the flip-flop 114 storing an error generated in the error value generator 113, the coefficient update of the coefficient updating parts 32 and the completion of the convolutional operation, should be in a half of symbol period, the equalizer as shown in FIG. 4 can reduce an error caused by the delaying elements. However, the performance of the equalizer in FIG. 4 is more or less deteriorated because of the additional flip-flop 301 or 302 which needs an additional symbol period.

Since the size of the multiplier 101, which multiplies the error of the coefficient updating parts 32 by the delayed input data, is approximately 10 $\mu$m×3 $\mu$m, the delayed time is very short and the delayed time caused by the shift register 102 to perform the bit operation can be ignored. Accordingly, it is possible to implement the equalizers as shown in FIGS. 3 and 4 without the reduction of the performance.

Figure 5:
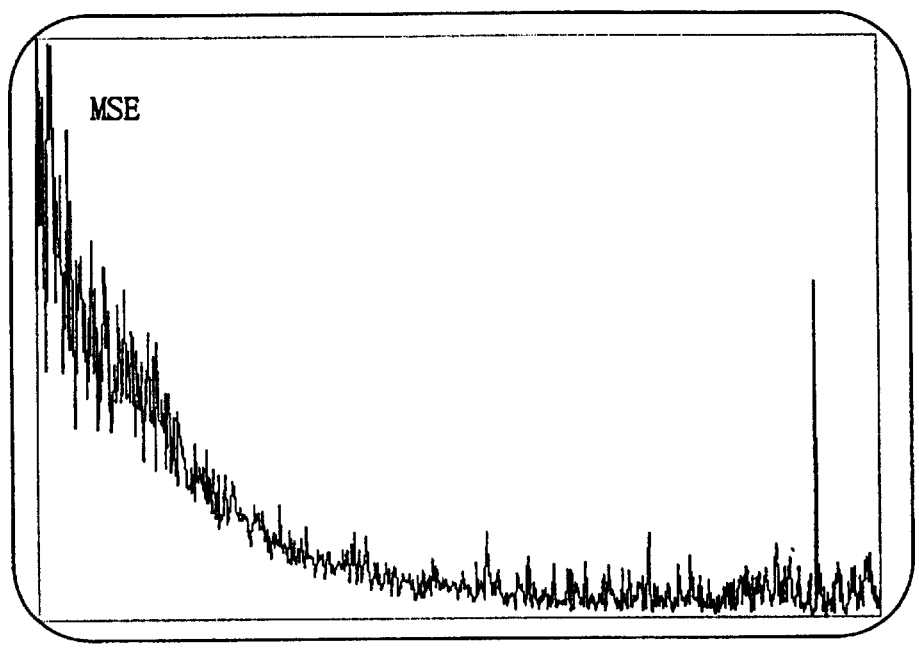
FIGS. 5 and 6 are plots showing simulation of the time division equalizer according to the present invention.
Figure 6:
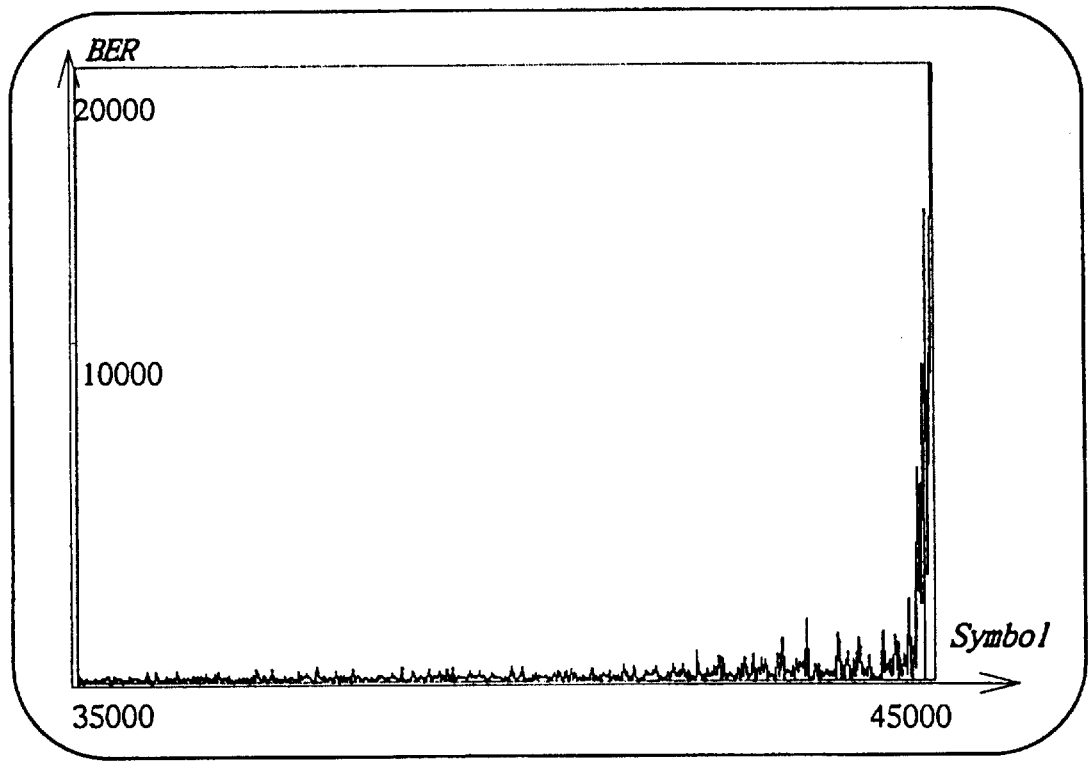

FIGS. 5 and 6 are plots showing simulation of the time division equalizer according to the present invention. As shown in FIG. 5, the error is reduced by the channel equalization while the time is increasing and, as shown in FIG. 6, the error correction is increased by the channel equalization.

As apparent from the above, the equalizer according to the present invention reduces the number of the multipliers, by using the time division. In particular, the equalizer can reduce the number of the multipliers in reversal proportion to the time division, thereby being implemented within one chip with the reduction of the fabrication cost. In the case where the tabs of the filters are designed within one module, the efficiency of the equalizer may be increased with easy. Further, the preset invention can be applied to adaptive filters such as an ADSL (Asymmetric Digital Subscriber Line) and an Echo-Canceler, as well as a QAM (Quadrature Amplitude Modulation) modem.

Although specific embodiments of the present invention are herein described, they are not to be constructed as limiting the scope of the invention. Many embodiments of the present invention will become clear to those skilled in the art in light of the methodology of the specification. The scope of the invention is limited only by the claims appended.

What is claimed is:

1. An adaptive equalizer comprising:
   a plurality of first delaying means for delaying input data in response to a symbol clock signal;
   a clock generating means receiving a system clock signal for producing a plurality of control signals using the system clock signal which is faster than the symbol clock signal, for classifying the delayed data;
   a plurality of selecting means for selecting output data from the first delaying means in response to the control signals provided by the clock generating means;
   a plurality of coefficient value updating means for receiving a previous error value and alternatively receiving the delayed and selected input data and then updating a coefficient value in response to the system clock signal;
   a convolutional operating means for receiving outputs of the coefficient value updating means and alternatively receiving the delayed and selected input data; and
   an error value generating means for calculating an error value from an output of the convolutional operating means and providing the calculated error to the plurality of coefficient value updating means.

2. The adaptive equalizer in accordance with claim 1, wherein the clock generating means receives the system clock signal, which is a few times as fast as the symbol clock signal, and produces the control signals which are out of phase.

3. The adaptive equalizer in accordance with claim 1, wherein the clock generating means receives the system clock signal, which is twice as fast as the symbol clock signal, and produces an odd clock signal and an even clock signal which are out of phase.

4. The adaptive equalizer in accordance with claim 3, wherein the coefficient value updating means comprises:
   a multiplier for receiving the error value corresponding to the previous output of the convolutional operating means and alternatively receiving the delayed odd or even data in response to the odd or even clock signals input into the plurality of selecting means;
   a shifting means for shifting an output of the multiplier;
   an adding means for adding an output of the coefficient value updating means prior to one symbol period to an output of the shifting means; and
   a second delaying means for delaying an output of the adding means and providing the delayed output to the adding means in response to the system clock signal.

5. The adaptive equalizer in accordance with claim 3, wherein the coefficient value updating means comprises:
   a multiplier for receiving the error value corresponding to the previous output of the convolutional operating means and alternatively receiving the delayed odd or even data in response to the odd or even clock signals input into the plurality of selecting means;
   a shifting means for shifting an output of the multiplier;
   an adding means for adding an output of the coefficient value updating means prior to one symbol period to an output of the shifting means;
   a second delaying means coupled to the adding means for selectively delaying an output of the adding means in response to the odd or even clock signals;
   a third delaying means for delaying an output of the second delaying means and providing the delayed output to the adding means in response to the system clock signal.

6. The adaptive equalizer in accordance with claim 3, wherein the convolutional operating means comprises:
   a plurality of multipliers coupled to the plurality of coefficient value updating means for receiving an output of the coefficient value updating means and alternatively receiving the delayed odd and even data in response to the odd and even clock signals input into the plurality of selecting means;

a first adding means for adding outputs of the plurality of multipliers;

a second delaying means for delaying an output of the first adding means; and a second adding means for adding the output of the first adding means to an output of the second delaying means.

7. The adaptive equalizer in accordance with claim 3, wherein the selecting means comprises a plurality of switching elements and alternatively provides odd and even data, each of which is selected by the odd clock signal and the even clock signal, respectively, to the coefficient value updating means and the convolutional operating means.

8. An adaptive equalizer including a plurality of delaying means for delaying input data in response to a symbol clock signal; a plurality of coefficient value updating means, a convolutional operating means and an error value generating means, the adaptive equalizer further comprising;

a plurality of selecting means for selecting output data from at least one delaying means in response to a plurality of control signals; and a clock generating means receiving a system clock signal for producing, in time division mode, the control signals using the system clock signal which is faster than the symbol clock signal, for classifying the delayed data, wherein the control signals are out of phase, wherein the coefficient value updating means updates a coefficient value in response to the system clock signal.

9. The adaptive equalizer in accordance with claim 8, wherein the clock generating means receives the system clock signal, which is twice as fast as the symbol clock signal, and produces an odd clock signal and an even clock signal.

10. The adaptive equalizer in accordance with claim 9, wherein the plurality of delaying means comprises N flip-flops coupled in series to one other, and the convolutional operating means comprises N/2 multipliers.

11. The adaptive equalizer in accordance with claim 10, wherein the adaptive equalizer comprises N/2 coefficient value updating means.

\* \* \* \* \*